(12) United States Patent
Wu et al.

(10) Patent No.: US 12,115,771 B2
(45) Date of Patent: Oct. 15, 2024

(54) ELECTRONIC DEVICES WITH MULTILAYER ADHESIVE

(71) Applicant: Apple Inc., Cupertino, CA (US)

(72) Inventors: Xiaowei Wu, San Jose, CA (US); Hoon Sik Kim, San Jose, CA (US); Yuxi Zhao, Sunnyvale, CA (US); Terry C Lam, Mountain View, CA (US); Yasmin F Afsar, San Jose, CA (US); Chang-Chia Huang, San Jose, CA (US); Bhadrinarayana Lalgudi Visweswaran, San Mateo, CA (US); Supriya Goyal, San Jose, CA (US); Paul S Drzaic, Morgan Hill, CA (US)

(73) Assignee: Apple Inc., Cupertino, CA (US)

( * ) Notice: Subject to any disclaimer, the term of this patent is extended or adjusted under 35 U.S.C. 154(b) by 323 days.

(21) Appl. No.: 17/716,911

(22) Filed: Apr. 8, 2022

(65) Prior Publication Data
US 2022/0388276 A1 Dec. 8, 2022

Related U.S. Application Data

(60) Provisional application No. 63/197,882, filed on Jun. 7, 2021.

(51) Int. Cl.
*H05K 5/03* (2006.01)
*B32B 7/12* (2006.01)
(Continued)

(52) U.S. Cl.
CPC ..................... *B32B 7/12* (2013.01); *C09J 7/00* (2013.01); *C09J 9/00* (2013.01); *H05K 5/0017* (2013.01);
(Continued)

(58) Field of Classification Search
CPC ...... B32B 7/12; C09J 7/00; C09J 9/00; H05K 5/03
(Continued)

(56) References Cited

U.S. PATENT DOCUMENTS 9,346,979 B2 5/2016 Sheridan et al.
10,411,205 B2 9/2019 Kwon et al.
(Continued)

FOREIGN PATENT DOCUMENTS

CN 111667769 A 9/2020

*Primary Examiner* — Binh B Tran
(74) *Attorney, Agent, or Firm* — Treyz Law Group, P.C.; Joseph F. Guihan; Jinie M. Guihan

(57) ABSTRACT

In devices with flexible displays, multilayer adhesive stacks may be included. A multilayer adhesive may attach a flexible display panel to the display cover layer in an electronic device. Including multiple layers of adhesive in the adhesive stack (as opposed to a single layer) provides more degrees of freedom for the tuning and optimization of the properties of the adhesive stack. The multilayer adhesive stack therefore has better performance than if only a single layer of adhesive is used. The multilayer adhesive stack may include one or more layers of soft adhesive, hard adhesive, hard elastomer, hard polymer, and/or glass to optimize the mechanical and optical performance of the multilayer adhesive stack. Soft adhesive layers may be included to optimize lateral decoupling (e.g., during folding and unfolding) of the adhesive stack. Harder layers may be included to provide rigidity and prevent denting during impact events.

29 Claims, 11 Drawing Sheets

(51) Int. Cl.
    *C09J 7/00*           (2018.01)
    *C09J 9/00*           (2006.01)
    *H05K 5/00*         (2006.01)

(52) U.S. Cl.
    CPC ............ H05K 5/03 (2013.01); *B32B 2457/20* (2013.01); *C09J 2203/318* (2013.01); *C09J 2301/124* (2020.08); *C09J 2301/312* (2020.08)

(58) Field of Classification Search
    USPC .......................................................... 361/749
    See application file for complete search history.

(56) References Cited

U.S. PATENT DOCUMENTS

| | | |
|---|---|---|
| 10,579,105 B2 | 3/2020 | Jones et al. |
| 10,686,148 B2 | 6/2020 | Jang et al. |
| 10,930,883 B2 | 2/2021 | Park |
| 11,024,828 B2 | 6/2021 | Kim et al. |
| 2016/0370508 A1* | 12/2016 | Jeong .................... G02B 5/3033 |
| 2017/0305134 A1* | 10/2017 | Hirakata .................... B32B 3/08 |
| 2019/0148670 A1 | 5/2019 | Wang et al. |
| 2020/0241594 A1* | 7/2020 | Cavallaro ................. B32B 7/12 |
| 2020/0251679 A1 | 8/2020 | Ha et al. |
| 2020/0409183 A1 | 12/2020 | Saylor et al. |
| 2023/0345652 A1* | 10/2023 | Sakamoto .............. H10K 59/00 |

\* cited by examiner

ELECTRONIC DEVICES WITH MULTILAYER ADHESIVE

This application claims the benefit of U.S. provisional patent application No. 63/197,882, filed Jun. 7, 2021, which is hereby incorporated by reference herein in its entirety.

FIELD

This relates generally to electronic devices, and, more particularly, to electronic devices with displays.

BACKGROUND

Electronic devices often have displays. Portability may be a concern for some devices, which tends to limit available real estate for displays.

SUMMARY

Electronic devices may be provided with displays. Displays may be used for displaying images for users. Displays may be formed from arrays of light-emitting diode pixels or other pixels. A device may have an organic light-emitting diode display or a display formed from an array of micro-light-emitting diodes (e.g., light-emitting diodes formed from crystalline semiconductor dies).

The displays may include flexible displays. Flexible displays may be bent about a bend axis to allow an electronic device to be folded and/or may be rolled around rollers. This allows the flexible display to be stored in an electronic device housing when a compact device arrangement is desired and to be pulled from within the electronic device housing when an enlarged display area is desired.

In devices with flexible displays, multilayer adhesive stacks may also be included. For example, a multilayer adhesive may attach a flexible display panel to the display cover layer in an electronic device. Including multiple layers of adhesive in the adhesive stack (as opposed to a single layer) provides more degrees of freedom for the tuning and optimization of the properties of the adhesive stack. The multilayer adhesive stack therefore has better performance than if only a single layer of adhesive is used.

The multilayer adhesive stack may include one or more layers of soft adhesive, hard adhesive, hard elastomer, hard polymer, and/or glass to optimize the mechanical and optical performance of the multilayer adhesive stack. Soft adhesive layers may be included to optimize lateral decoupling (e.g., during folding and unfolding) of the adhesive stack.

Harder layers may be included to provide rigidity and prevent denting during impact events. One or more adhesive layers may be included that are optimized for low temperature performance. One or more adhesion promotion layers may be included in the adhesive stack.

The multilayer adhesive stack may have different, coplanar materials in addition to different materials in the thickness direction. Softer materials may be included in a strip that overlaps a bend axis of the device, as one example.

DETAILED DESCRIPTION

Electronic devices may be provided with displays. Displays may be used for displaying images for users. Displays may be formed from arrays of light-emitting diode pixels or other pixels. For example, a device may have an organic light-emitting diode display or a display formed from an array of micro-light-emitting diodes (e.g., light-emitting diodes formed from crystalline semiconductor dies).

The displays may include flexible displays. Flexible displays may be bent about a bend axis to allow an electronic device to be folded and/or may be rolled around rollers. This allows the flexible display to be stored in an electronic device housing when a compact device arrangement is desired and to be pulled from within the electronic device housing when an enlarged display area is desired. An electronic device may incorporate both foldable and scrollable displays or may have foldable displays and/or scrollable displays in a housing that also includes one or more rigid displays.

Figure 1:
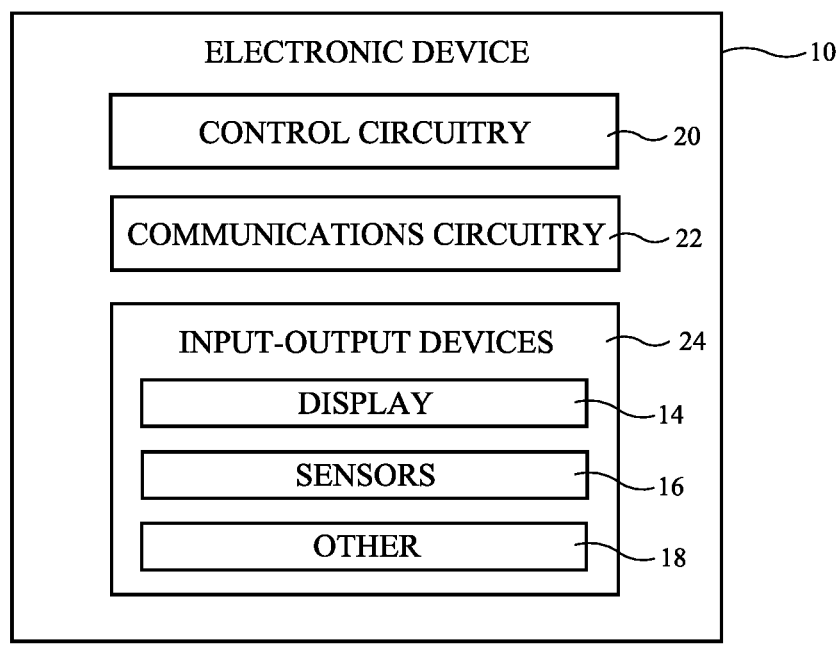
FIG. 1 is a schematic diagram of an illustrative electronic device in accordance with an embodiment.

A schematic diagram of an illustrative electronic device having a flexible display is shown in FIG. 1. Device 10 may be a cellular telephone, tablet computer, laptop computer, wristwatch device or other wearable device, a television, a stand-alone computer display or other monitor, a computer display with an embedded computer (e.g., a desktop computer), a system embedded in a vehicle, kiosk, or other embedded electronic device, a media player, or other electronic equipment. Configurations in which device 10 is a cellular telephone, tablet computer, or other portable electronic device may sometimes be described herein as an example. This is illustrative. Device 10 may, in general, be any suitable electronic device with a display.

Device 10 may include control circuitry 20. Control circuitry 20 may include storage and processing circuitry for supporting the operation of device 10. The storage and processing circuitry may include storage such as nonvolatile memory (e.g., flash memory or other electrically-programmable-read-only memory configured to form a solid state drive), volatile memory (e.g., static or dynamic random-access-memory), etc. Processing circuitry in control circuitry 20 may be used to gather input from sensors and other input devices and may be used to control output devices. The processing circuitry may be based on one or more microprocessors, microcontrollers, digital signal processors, baseband processors and other wireless communications circuits, power management units, audio chips, application specific integrated circuits, etc. During operation, control circuitry 20 may use a display and other output devices in providing a user with visual output and other output.

To support communications between device 10 and external equipment, control circuitry 20 may communicate using communications circuitry 22. Circuitry 22 may include antennas, radio-frequency transceiver circuitry (wireless transceiver circuitry), and other wireless communications circuitry and/or wired communications circuitry. Circuitry 22, which may sometimes be referred to as control circuitry and/or control and communications circuitry, may support bidirectional wireless communications between device 10 and external equipment over a wireless link (e.g., circuitry 22 may include radio-frequency transceiver circuitry such as wireless local area network transceiver circuitry configured to support communications over a wireless local area network link, near-field communications transceiver circuitry configured to support communications over a near-field communications link, cellular telephone transceiver circuitry configured to support communications over a cellular telephone link, or transceiver circuitry configured to support communications over any other suitable wired or wireless communications link). Wireless communications may, for example, be supported over a Bluetooth® link, a WiFi® link, a wireless link operating at a frequency between 6 GHz and 300 GHz, a 60 GHz link, or other millimeter wave link, cellular telephone link, wireless local area network link, personal area network communications link, or other wireless communications link. Device 10 may, if desired, include power circuits for transmitting and/or receiving wired and/or wireless power and may include batteries or other energy storage devices. For example, device 10 may include a coil and rectifier to receive wireless power that is provided to circuitry in device 10.

Device 10 may include input-output devices such as devices 24. Input-output devices 24 may be used in gathering user input, in gathering information on the environment surrounding the user, and/or in providing a user with output. Devices 24 may include one or more displays such as display 14. Display 14 may be an organic light-emitting diode display, a liquid crystal display, an electrophoretic display, an electrowetting display, a plasma display, a microelectromechanical systems display, a display having a pixel array formed from crystalline semiconductor light-emitting diode dies (sometimes referred to as microLEDs), and/or other display. Configurations in which display 14 is an organic light-emitting diode display or microLED display are sometimes described herein as an example.

Display 14 may have an array of pixels configured to display images for a user. The pixels may be formed as part of a display panel that is flexible. A flexible display (e.g., an organic light-emitting diode display formed on a sheet of polymer or other flexible substrate and/or other flexible display pixel array structures) may be used to permit device 10 to be bent and/or stretched to allow display 14 to be folded and/or scrolled (e.g., to allow the visible area of display 14 to be expanded by moving display 14 in or out of a housing using a roller). A flexible display may be folded and unfolded about a bend axis. For example, a flexible (bendable) display in device 10 may be folded so that device 10 may be placed in a compact shape for storage and may be unfolded when it is desired to view images on the display.

Sensors 16 in input-output devices 24 may include force sensors (e.g., strain gauges, capacitive force sensors, resistive force sensors, etc.), audio sensors such as microphones, touch and/or proximity sensors such as capacitive sensors (e.g., a two-dimensional capacitive touch sensor integrated into display 14, a two-dimensional capacitive touch sensor overlapping display 14, and/or a touch sensor that forms a button, trackpad, or other input device not associated with a display), and other sensors. If desired, sensors 16 may include optical sensors such as optical sensors that emit and detect light, ultrasonic sensors, optical touch sensors, optical proximity sensors, and/or other touch sensors and/or proximity sensors, monochromatic and color ambient light sensors, image sensors, fingerprint sensors, temperature sensors, sensors for measuring three-dimensional non-contact gestures ("air gestures"), pressure sensors, sensors for detecting position, orientation, and/or motion (e.g., accelerometers, magnetic sensors such as compass sensors, gyroscopes, and/or inertial measurement units that contain some or all of these sensors), health sensors, radio-frequency sensors, depth sensors (e.g., structured light sensors and/or depth sensors based on stereo imaging devices that capture three-dimensional images), optical sensors such as self-mixing sensors and light detection and ranging (lidar) sensors that gather time-of-flight measurements, humidity sensors, moisture sensors, gaze tracking sensors, and/or other sensors. In some arrangements, device 10 may use sensors 16 and/or other input-output devices to gather user input. For example, buttons may be used to gather button press input, touch sensors overlapping displays can be used for gathering user touch screen input, touch pads may be used in gathering touch input, microphones may be used for gathering audio input, accelerometers may be used in monitoring when a finger contacts an input surface and may therefore be used to gather finger press input, etc.

If desired, electronic device 10 may include additional components (see, e.g., other devices 18 in input-output devices 24). The additional components may include haptic output devices, audio output devices such as speakers, light-emitting diodes for status indicators, light sources such as light-emitting diodes that illuminate portions of a housing and/or display structure, other optical output devices, and/or other circuitry for gathering input and/or providing output. Device 10 may also include a battery or other energy storage device, connector ports for supporting wired communication with ancillary equipment and for receiving wired power, and other circuitry.

Figure 2:
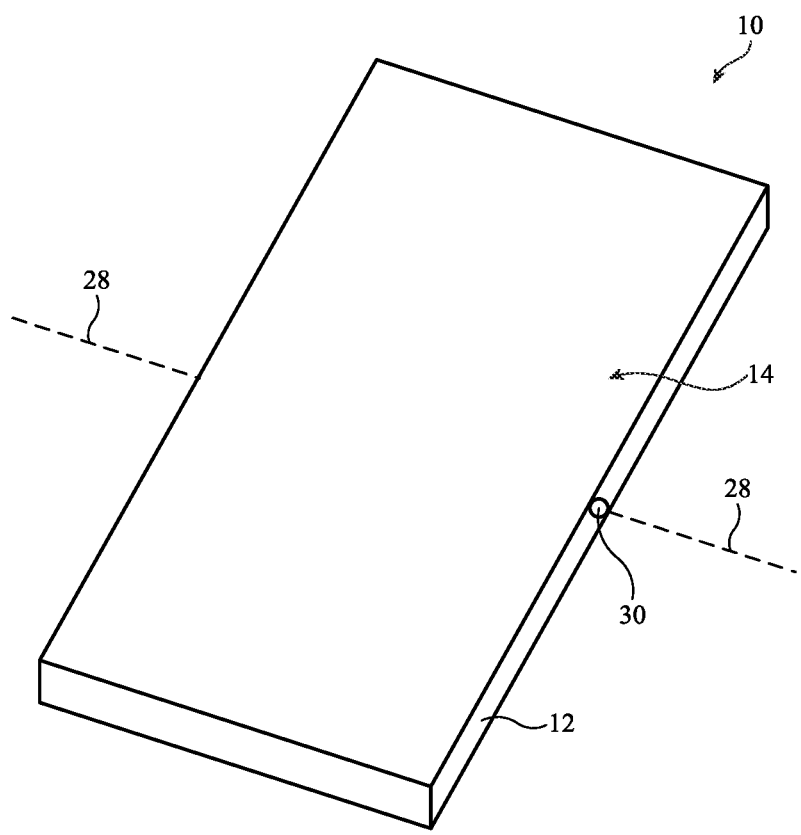
FIG. 2 is a perspective view of an illustrative electronic device with a display in accordance with an embodiment.

FIG. 2 is a perspective view of electronic device 10 in an illustrative configuration in which device 10 is a portable electronic device such as a cellular telephone or tablet computer. As shown in FIG. 2, device 10 may have a display such as display 14. Display 14 may cover some or all of the front face of device 10. Touch sensor circuitry such as two-dimensional capacitive touch sensor circuitry may be incorporated into display 14.

Display 14 may be mounted in housing 12. Housing 12 may form front and rear housing walls, sidewall structures, and/or internal supporting structures (e.g., a frame, an optional midplate member, etc.) for device 10. Glass structures, transparent polymer structures, and/or other transparent structures that cover display 14 and other portions of device 10 may provide structural support for device 10 and may sometimes be referred to as housing structures. For example, a transparent housing portion such as a glass or polymer housing structure that covers and protects a pixel array in display 14 may serve as a display cover layer for the pixel array while also serving as a housing wall on the front face of device 10. In configurations in which a display cover layer is formed from glass, the display cover layer may sometimes be referred to as a display cover glass or display cover glass layer. The portions of housing 12 on the sidewalls and rear wall of device 10 may be formed from glass or other transparent structures and/or opaque structures. Sidewalls and rear wall structures may be formed as extensions to the front portion of housing 12 (e.g., as integral portions of the display cover layer) and/or may include separate housing wall structures.

Housing 12 may have flexible structures (e.g., bendable housing wall structures) and/or hinge structures such as hinge 30. Hinge 30 may have a hinge axis aligned with device bend axis 28. Hinge 30 and/or flexible housing structures that overlap bend axis 28 may allow housing 12 to bend about bend axis 28. For example, housing 12 may have a first portion on one side of bend axis 28 and a second portion on an opposing side of bend axis 28 and these two housing portions may be coupled by hinge 30 for rotational motion about axis 28.

As housing 12 is bent about bend axis 28, the flexibility of display 14 allows display 14 to bend about axis 28. In an illustrative configuration, housing 12 and display 14 may bend by 180°. This allows display 14 to be folded back on itself (with first and second outwardly-facing portions of display 14 facing each other). The ability to place device 10 in a folded configuration in this way may help make device 10 compact so that device 10 can be stored efficiently. When it is desired to view images on display 14, device 10 may be unfolded about axis 28 to place device 10 in the unfolded configuration of FIG. 2. This allows display 14 to lie flat and allows a user to view flat images on display 14. The ability to fold display 14 onto itself allows device 10 to exhibit an inwardly folding behavior. Display 14 may be sufficiently flexible to allow device 10 to be folded outwardly and/or inwardly.

Device 10 of FIG. 2 has a rectangular outline (rectangular periphery) with four corners. As shown in FIG. 2, a first pair of parallel edges (e.g., the left and right edges of device 10 in the example of FIG. 2) may be longer than a second pair of parallel edges (e.g., the upper and lower edges of device 10 of FIG. 2) that are oriented at right angles to the first pair of parallel edges. In this type of configuration, housing 12 is elongated along a longitudinal axis that is perpendicular to bend axis 28. Housing 12 may have other shapes, if desired (e.g., shapes in which housing 12 has a longitudinal axis that extends parallel to bend axis 28). With an arrangement of the type shown in FIG. 2, the length of device 10 along its longitudinal axis may be reduced by folding device 10 about axis 28.

Figure 3:
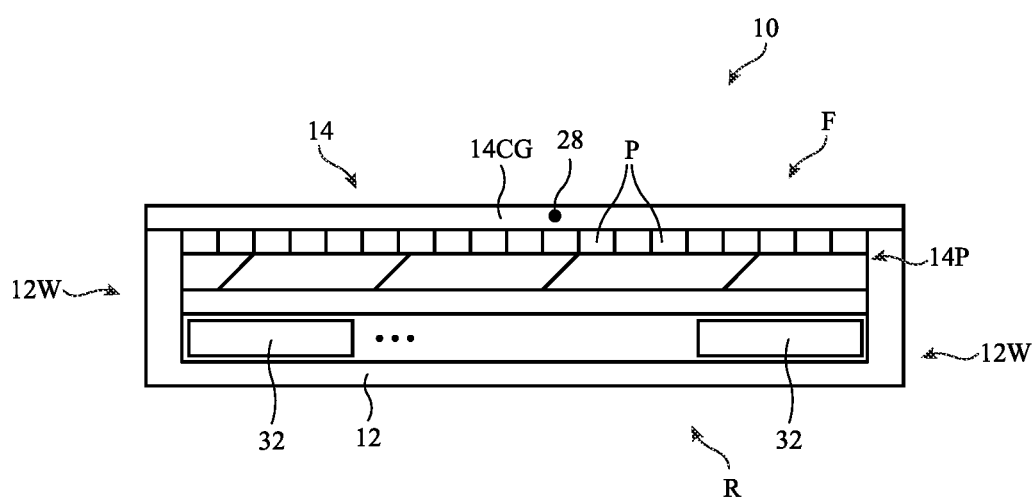
FIG. 3 is a cross-sectional side view of an illustrative electronic device in accordance with an embodiment.

FIG. 3 is a cross-sectional side view of an illustrative foldable electronic device. Device 10 of FIG. 3 may bend about bend axis 28. Bend axis 28 may be aligned with display cover layer 14CG or other structures in device 10. For example, bend axis 28 may pass through a portion of display cover layer 14CG or may be located above or below layer 14CG.

As shown in FIG. 3, display 14 includes an array of pixels P forming display panel 14P under an inwardly facing surface of display cover layer 14CG. Display panel 14P may be, for example, a flexible organic light-emitting diode display or a microLED display in which light-emitting pixels are formed on a flexible substrate layer (e.g., a flexible layer of polyimide or a sheet of other flexible polymer). Flexible support layer(s) for display 14 may also be formed from flexible glass, flexible metal, and/or other flexible structures.

Display cover layer 14CG may be formed from polymer, glass, crystalline materials such as sapphire, other materials, and/or combinations of these materials. To locally increase flexibility, a portion of layer 14CG that overlaps and extends along bend axis 28 may be locally thinned (e.g., this portion may be thinned relative to portions of layer 14CG that do not overlap bend axis 28). The thickness of layer 14CG (e.g., the non-thinned portions of layer 14CG) may be 50-200 microns, 70-150 microns, 100-200 microns, 100-600 microns, at least 100 microns, at least 200 microns, less than 600 microns, less than 400 microns, less than 250 microns, less than 150 microns, less than 100 microns, at least 50 microns, or other suitable thickness.

In the example of FIG. 3, housing 12 has a portion on rear face R that forms a rear housing wall and has side portions forming sidewalls 12W. The rear housing wall of housing 12 may form a support layer for components in device 10. Housing 12 may also have one or more interior supporting layers (e.g., frame structures such as an optional midplate, etc.). These interior supporting layers and the rear housing wall may have first and second portions that are coupled to opposing sides of a hinge that is aligned with bend axis 28 (see, e.g., hinge 30 of FIG. 2) or may be sufficiently flexible to bend around bend axis 28.

Electrical components 32 may be mounted in the interior of device 10 (e.g., between display 14 and the rear of housing 12. Components 32 may include circuitry of the type shown in FIG. 1 (e.g., control circuitry 20, communications circuitry 22, input-output devices 24, batteries, etc.). Display 14 may be mounted on front face F of device 10. When device 10 is folded about axis 28, display cover layer 14CG, display panel 14P, and the other structures of device 10 that overlap bend axis 28 may flex and bend to accommodate folding.

Figure 4:
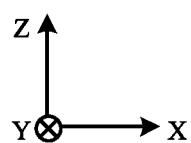
FIG. 4 is a cross-sectional side view of an illustrative display with a multilayer adhesive stack that is interposed between a display panel and a display cover layer in accordance with an embodiment.
Figure 4:
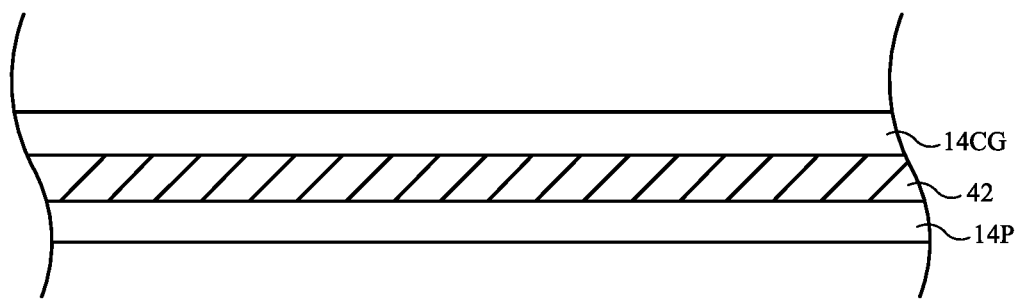

FIG. 4 is a cross-sectional side view of display 14 showing how a multilayer adhesive stack may be used to attach the display panel 14P to the display cover layer 14CG. Multilayer adhesive stack 42 (sometimes referred to as multilayer adhesive 42 or adhesive 42) may include two or more layers. Although some of the layers in the adhesive stack may have higher adhesion than other layers, all of the layers in multilayer adhesive stack 42 may be referred to as adhesive layers. Including multiple layers in adhesive stack 42 (as opposed to a single layer) may allow for optimization of the properties of the adhesive for the particular display application (e.g., a foldable display).

In the example where display 14 is a foldable display (e.g., that bends around a bend axis as in FIG. 3), it may be desirable for adhesive 42 to be soft in order to have high decoupling in the lateral direction (to allow easy folding and unfolding). Specifically, the modulus of the adhesive may desirably be low in the lateral direction. However, it may also be desirable for adhesive 42 to be sufficiently hard to minimize denting in the thickness direction. The adhesive also needs to have sufficient adhesive strength to attach components within the display. The adhesive also may need to have sufficient performance at a wide range of operating temperatures. To balance these considerations, multiple layers of adhesive may be used in the adhesive stack. Including multiple layers of adhesive in the adhesive stack provides more degrees of freedom for the tuning and optimization of the properties of the adhesive stack. The multilayer adhesive stack therefore has better performance than if only a single layer of adhesive is used.

FIG. 4 shows an example where the multilayer adhesive is interposed between and in direct contact with display cover layer 14CG and display panel 14P. In other words, the multilayer adhesive has an upper surface that is in direct contact with the display cover layer 14CG and a lower surface that is in direct contact with the display panel 14P. This example is merely illustrative. Multilayer adhesive stacks may be incorporated in other locations within an electronic device with a flexible display.

Figure 5:
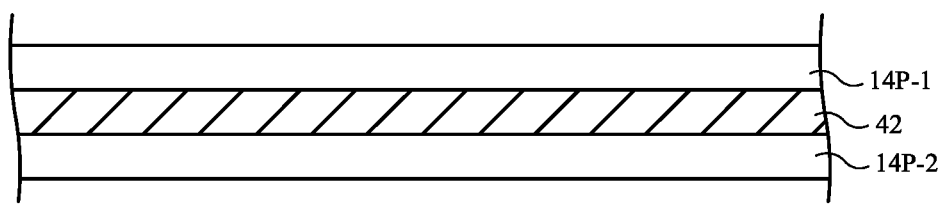
FIG. 5 is a cross-sectional side view of an illustrative display with a multilayer adhesive stack that is interposed between first and second portions of a display panel in accordance with an embodiment.

FIG. 5 is a cross-sectional side view of a display showing an example where multilayer adhesive 42 is interposed between a first component 14P-1 in the display panel and a second component 14P-2 in the display panel. In other words, multilayer adhesive 42 may be used to attach adjacent layers within the display panel (different portions of the display panel). The multilayer adhesive has an upper surface that is in direct contact with display panel component 14P-1 and a lower surface that is in direct contact with display panel component 14P-2.

Figure 6:
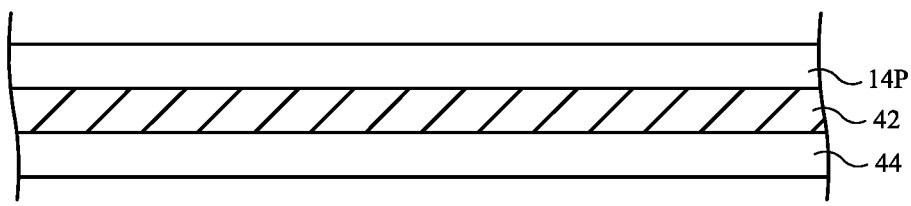
FIG. 6 is a cross-sectional side view of an illustrative display with a multilayer adhesive stack that is interposed between a display panel and an additional component in accordance with an embodiment.

FIG. 6 is a cross-sectional side view of a display showing an example where multilayer adhesive 42 is interposed between display panel 14P and an additional component 44. Additional component 44 may be a structural component (e.g., a housing wall, a midplate, etc.) and/or an electronic component (e.g., a printed circuit board, an input-output component, etc.). The multilayer adhesive has an upper surface that is in direct contact with display panel 14P and a lower surface that is in direct contact with component 44.

Figure 7:
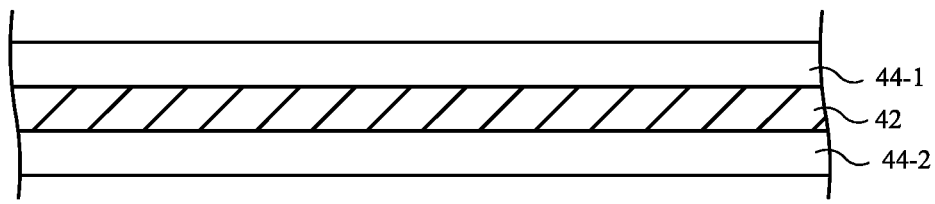
FIG. 7 is a cross-sectional side view of an illustrative display with a multilayer adhesive stack that is interposed between first and second components in accordance with an embodiment.

FIG. 7 is a cross-sectional side view of a display showing an example where multilayer adhesive 42 is interposed between component 44-1 and component 44-2. Each one of components 44-1 and 44-2 may be a structural component (e.g., a housing wall, a midplate, etc.) and/or an electronic component (e.g., a display component, a printed circuit board, an input-output component, etc.). The multilayer adhesive has an upper surface that is in direct contact with component 44-1 and a lower surface that is in direct contact with component 44-2.

When the multilayer adhesive is formed above the light-emitting portion of display panel 14P (e.g., as in FIGS. 4 and 5 but not FIGS. 6 and 7), the multilayer adhesive may have a high transparency (e.g., greater than 80%, greater than 90%, greater than 95%, greater than 99%, etc.). When the multilayer adhesive is not formed above the light-emitting portion of display panel 14P (e.g., as in FIGS. 6 and 7), the multilayer adhesive need not necessarily have a high transparency and may have any desired transparency (e.g., may be opaque).

Figure 8:
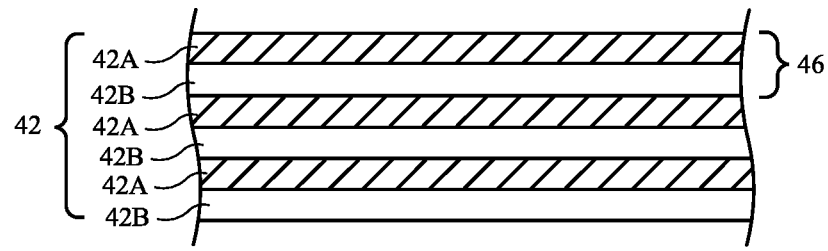
FIG. 8 is a cross-sectional side view of an illustrative multilayer adhesive stack that includes a repeating unit of first and second layers in accordance with an embodiment.

The multilayer adhesive stack may be formed from a repeating unit of two or more adhesive layers. FIG. 8 is a cross-sectional side view of a multilayer adhesive stack 42 formed from a repeating unit of two adhesive layers. As shown, repeating unit 46 includes adhesive layer 42A and adhesive layer 42B. Adhesive layers 42A and 42B may be formed from different materials having different properties in order to optimize the performance of the adhesive. Each adhesive layer 42A may be formed from the same material (e.g., a first material) and each adhesive layer 42B may be formed from the same material (e.g., a second material that is different than the first material). The repeating unit 46 is repeated throughout the multilayer adhesive stack.

Figure 9:
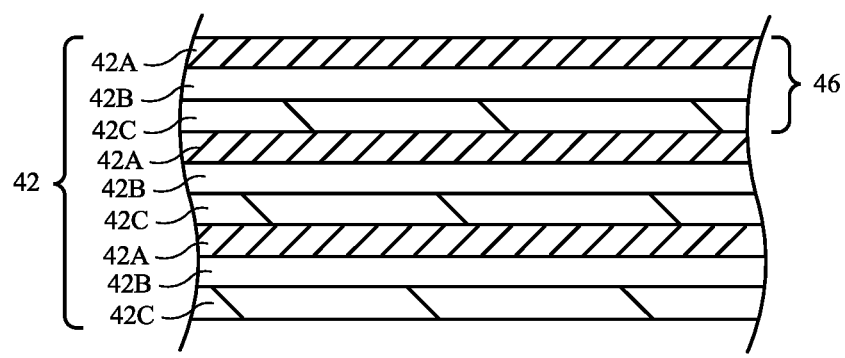
FIG. 9 is a cross-sectional side view of an illustrative multilayer adhesive stack that includes a repeating unit of first, second, and third layers in accordance with an embodiment.

The example in FIG. 8 of the repeating unit including two different adhesive layers is merely illustrative. In another example, shown in FIG. 9, the repeating unit includes three different adhesive layers (42A, 42B, and 42C). Adhesive layers 42A, 42B, and 42C may be formed from different materials having different properties in order to optimize the performance of the adhesive. Each adhesive layer 42A may be formed from the same material (e.g., a first material), each adhesive layer 42B may be formed from the same material (e.g., a second material that is different than the first material), and each adhesive layer 42C may be formed from the same material (e.g., a third material that is different than the first and second materials). The repeating unit 46 is repeated throughout the multilayer adhesive stack.

Figure 10:
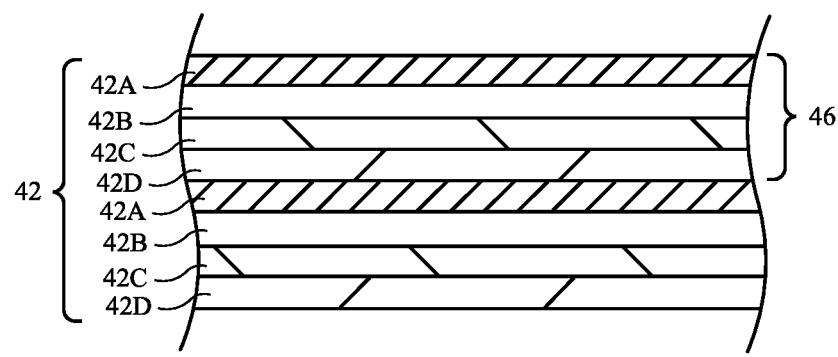
FIG. 10 is a cross-sectional side view of an illustrative multilayer adhesive stack that includes a repeating unit of first, second, third, and fourth layers in accordance with an embodiment.

In another example, shown in FIG. 10, the repeating unit includes four different adhesive layers (42A, 42B, 42C, and 42D). Adhesive layers 42A, 42B, 42C, and 42D may be formed from different materials having different properties in order to optimize the performance of the adhesive. Each adhesive layer 42A may be formed from the same material (e.g., a first material), each adhesive layer 42B may be formed from the same material (e.g., a second material that is different than the first material), each adhesive layer 42C may be formed from the same material (e.g., a third material that is different than the first and second materials), and each adhesive layer 42D may be formed from the same material (e.g., a fourth material that is different than the first, second, and third materials). The repeating unit 46 is repeated throughout the multilayer adhesive stack.

Figure 11:
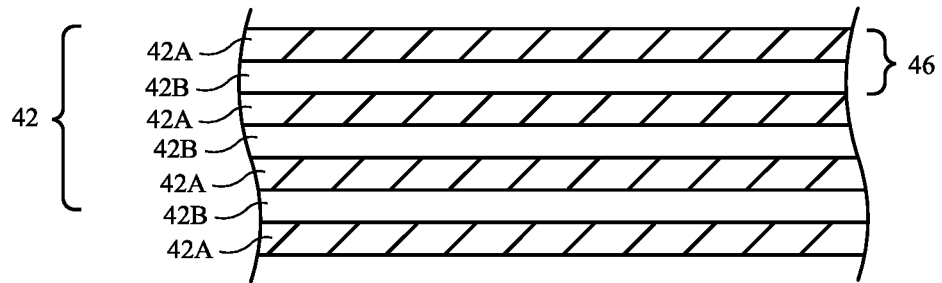
FIG. 11 is a cross-sectional side view of an illustrative multilayer adhesive stack where the final repeating unit on one side of the multilayer stack includes less than all of the layers of the repeating unit in accordance with an embodiment.

If desired, the final repeating unit in the multilayer stack may not be included in its entirety. FIG. 11 shows an example where, at the bottom of the multilayer adhesive stack, only adhesive layer 42A is included (instead of layers 42A and 42B as in the preceding instances of the repeating unit). Each adhesive layer 42A may be formed from the same material (e.g., a first material) and each adhesive layer 42B may be formed from the same material (e.g., a second material that is different than the first material). This concept may be applied to a multilayer adhesive stack regardless of the number of adhesive layers in the repeating unit. For example, when the repeating unit has three layers as in FIG. 9, only one of the three layers or only two of the three layers may be included on one side of the multilayer stack if desired. When the repeating unit has four layers as in FIG. 10, only one of the four layers, only two of the four layers, or only three of the four layers may be included on one side of the multilayer stack if desired.

In general, the multilayer adhesive 42 may include any desired number of adhesive layers (e.g., two layers, three layers, four layers, five layers, six layers, seven layers, eight layers, nine layers, ten layers, more than ten layers, more than twelve layers, more than twenty layers, more than forty layers, less than fifty layers, less than twenty layers, less than ten layers, less than six layers, between (inclusive) two and ten layers, etc.). The adhesive layers in multilayer adhesive may include a repeating unit of any desired number of layers (e.g., two layers, three layers, four layers, more than four layers, etc.). The final repeating unit on one side of the multilayer stack may optionally include less than all of the layers of the repeating unit.

Figure 12:
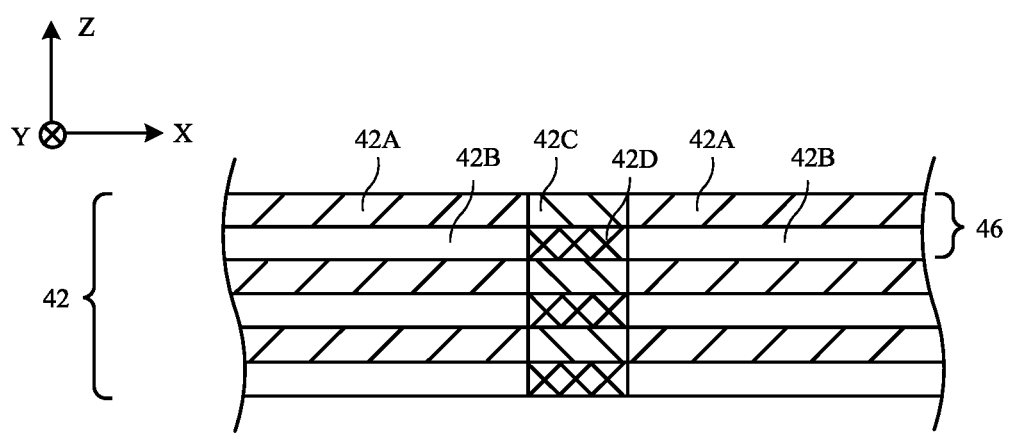
FIGS. 12 and 13 are cross-sectional side views of illustrative multilayer adhesive stacks that include coplanar adhesive layers formed from different materials in accordance with an embodiment.

In addition to including multiple layers in the thickness direction, the multilayer adhesive stack may be heterogenous within the XY-plane. FIG. 12 shows how the multilayer adhesive stack 42 may include a repeating unit 46. Similar to as in FIG. 8, the repeating unit 46 includes adhesive layers 42A and 42B. However, each adhesive layer 42A is interrupted by a coplanar adhesive layer 42C within the XY-plane and each adhesive layer 42B is interrupted by a coplanar adhesive layer 42D within the XY-plane. Adhesive layers 42C and 42D may overlap a bend axis of a foldable display, as one example. Adhesive layer 42C may be surrounded (within the XY-plane) by adhesive layer 42A and adhesive layer 42D may be surrounded (within the XY-plane) by adhesive layer 42B. Adhesive layers 42A, 42B, 42C, and 42D may be formed from different materials having different properties in order to optimize the performance of the adhesive. Each adhesive layer 42A may be formed from the same material (e.g., a first material), each adhesive layer 42B may be formed from the same material (e.g., a second material that is different than the first material), each adhesive layer 42C may be formed from the same material (e.g., a third material that is different than the first and second materials), and each adhesive layer 42D may be formed from the same material (e.g., a fourth material that is different than the first, second, and third materials). The repeating unit 46 is repeated throughout the multilayer adhesive stack.

Figure 13:
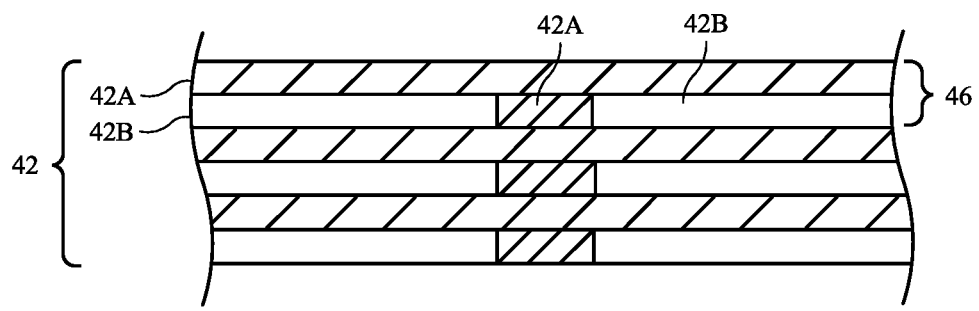

FIG. 13 is a cross-sectional side view of another multilayer adhesive stack with one or more layers that are heterogeneous within the XY-plane. Similar to as in FIG. 8, the repeating unit 46 includes adhesive layers 42A and 42B. However, each adhesive layer 42B in FIG. 13 is interrupted by an adhesive layer 42A within the XY-plane. Adhesive layers 42A (that are coplanar with adhesive layer 42B) may overlap a bend axis of a foldable display, as one example. Adhesive layers 42A overlapping the bend axis may be surrounded (within the XY-plane) by adhesive layer 42B. Adhesive layers 42A and 42B may be formed from different materials having different properties in order to optimize the performance of the adhesive. Each adhesive layer 42A may be formed from the same material (e.g., a first material) and each adhesive layer 42B may be formed from the same material (e.g., a second material that is different than the first material). The repeating unit 46 is repeated throughout the multilayer adhesive stack.

In yet another possible arrangement, the adhesive stack may include only a single layer in the thickness direction but may be heterogeneous within the XY-plane. Within the single adhesive layer, adhesive of a first material may overlap a bend axis of a foldable display (as one example). The adhesive of the first material may be surrounded (within the XY-plane) by an adhesive layer of a second material that is different than the first material. The first material may be softer than the second material.

Any of the multilayer adhesive stacks in FIG. 8-13 may be used in any of the locations shown in FIGS. 4-7. Any desired materials may be used in the aforementioned multilayer adhesive stacks of FIGS. 8-13. Illustrative materials that may be used for any of the adhesive layers include soft adhesive, hard adhesive, hard polymer, hard elastomer, glass, etc. Generally, materials may be characterized by Young's modulus and tensile modulus (E) that measure tensile stress and tensile strain behavior and shear modulus (G) that measure shear stress and sheer strain. Modulus is a complex number with a real part characterizing the elastic behavior and an imaginary part characterizing viscous behavior. For example, tensile modulus (E) is a complex modulus (E*) with a real part (storage modulus E') and an imaginary part (loss modulus E"). Shear modulus (G) is a complex modulus (G*) with a real part (storage modulus G') and an imaginary part (loss modulus G"). Each layer in the multilayer adhesive stack may have a modulus (E', E", E*, G', G", or G*) (e.g., at room temperature and an oscillation frequency of 1 Hz) of less than 1 megapascal (MPa), less than 0.5 Mpa, less than 0.1 MPa, less than 0.05 MPa, between 0.01 MPa and 0.5 MPa, between 0.001 MPa and 0.1 MPa, between 0.1 MPa and 0.2 MPa, greater than 1 MPa, between 1 MPa and 1 gigapascal (GPa), between 1 MPa and 500 MPa, between 500 MPa and 1 GPa, between 500 MPa and 1.5 GPa, greater than 1 GPa, greater than 10 GPa, greater than 20 GPa, etc. Each layer in the multilayer adhesive stack may have a modulus at various other temperatures (e.g., −20 degrees Celsius, −40 degrees Celsius, 65 degrees Celsius, 80 degrees Celsius, greater than −20 degrees Celsius, greater than 0 degrees Celsius, greater than 20 degrees Celsius, between (inclusive) −20 degrees Celsius and 70 degrees Celsius, less than 70 degrees Celsius, less than 20 degrees Celsius, less than 0 degrees Celsius, less than −20 degrees Celsius, less than −40 degrees Celsius, etc.) of less than 1 megapascal (MPa), less than 0.5 Mpa, less than 0.1 MPa, less than 0.05 MPa, between 0.01 MPa and 0.5 MPa, between 0.001 MPa and 0.1 MPa, between 0.1 MPa and 0.2 MPa, greater than 1 MPa, between 1 MPa and 1 gigapascal (GPa), between 1 MPa and 500 MPa, between 500 MPa and 1 GPa, between 500 MPa and 1.5 GPa, greater than 1 GPa, greater than 10 GPa, greater than 20 GPa, etc.

Modulus characterizes small deformation behavior in the linear regime. Materials (e.g. materials used in the adhesive stack) may also be characterized by large deformation behavior. For example, each layer in the multilayer adhesive stack may have a shear stress (at room temperature and 500% shear strain using 200%/min strain rate) of between 5 kPa and 50 kPa, less than 1 kPa, less than 0.1 kPa, less than 10 kPa, less than 100 kPa, less than 1000 kPa, less than 1 GPa, more than 1 kPa, more than 0.1 kPa, more than 10 kPa, more than 100 kPa, more than 1000 kPa, more than 1 GPa, between 1 kPa and 100 kPa, etc. This example of shear stress test conditions is merely illustrative. In general, at any desired temperature (e.g., −20 degrees Celsius, −40 degrees Celsius, 65 degrees Celsius, 80 degrees Celsius, greater than −20 degrees Celsius, greater than 0 degrees Celsius, greater than 20 degrees Celsius, between (inclusive) −20 degrees Celsius and 70 degrees Celsius, less than 70 degrees Celsius, less than 20 degrees Celsius, less than 0 degrees Celsius, less than −20 degrees Celsius, less than −40 degrees Celsius, etc.), any desired strain level (e.g., 500%, 200%, 2000%, less than 200%, less than 500%, less than 2000%, more than 200%, more than 500%, more than 2000%, between 200% and 2000%, etc.), and any desired strain rate (e.g., 200%/min, 2000%/min, 50,000%/min, more than 200%/min, more than 2000%/min, more than 50,000%/min, less than 200%/min, less than 2000%/min, less than 50,000%/min, between 200%/min and 2000%/min, between 200%/min and 50,000%/min, etc.), each layer in the multilayer adhesive stack may have a shear stress of between 5 kPa and 50 kPa, less than 1 kPa, less than 0.1 kPa, less than 10 kPa, less than 100 kPa, less than 1000 kPa, less than 1 GPa, more than 1 kPa, more than 0.1 kPa, more than 10 kPa, more than 100 kPa, more than 1000 kPa, more than 1 GPa between 1 kPa and 100 kPa, etc.

Each layer in the multilayer adhesive stack may have a glass transition temperature that is greater than −20 degrees Celsius, greater than 0 degrees Celsius, greater than 20 degrees Celsius, between (inclusive) −20 degrees Celsius and 70 degrees Celsius, less than 70 degrees Celsius, less than 20 degrees Celsius, less than 0 degrees Celsius, less than −20 degrees Celsius, less than −40 degrees Celsius, etc. Each layer in the multilayer adhesive stack may have a transparency to visible light that is greater than 99.9%, greater than 99%, greater than 95%, greater than 90%, greater than 80%, less than 80%, less than 70%, less than 50%, between (inclusive) 90% and 100%, etc. Each layer in the multilayer adhesive stack may have a thickness that is less than 200 microns, less than 100 microns, less than 50 microns, less than 40 microns, less than 30 microns, less than 20 microns, less than 10 microns, less than 5 microns, less than 1 micron, greater than 1 micron, greater than 5 microns, between 1 and 40 microns, between 3 and 25 microns, etc. The total thickness of multilayer adhesive stack 42 may be less than 200 microns, less than 100 microns, less than 75 microns, less than 50 microns, greater than 35 microns, between 25 microns and 75 microns, between 25 microns and 200 microns, etc.

One illustrative multilayer adhesive stack may include alternating layers of soft adhesive and hard polymer. For example, adhesive layer 42A in FIG. 8 (or FIGS. 9-13) may be formed from a soft adhesive and adhesive layer 42B in FIG. 8 (or FIGS. 9-13) may be formed from a hard polymer. The soft adhesive layer 42A may have a modulus (E', E", E*, G', G", or G*) (e.g., at room temperature and an oscillation frequency of 1 Hz) of less than 1 megapascal (MPa), less than 0.5 Mpa, less than 0.1 MPa, less than 0.05 MPa, less than 0.01 MPa, less than 0.001 MPa, between 0.01 MPa and 0.5 MPa, between 0.01 MPa and 0.1 MPa, between 0.1 MPa and 0.2 MPa, etc. The hard polymer layer 42B may have a modulus (E', E", E*, G', G", or G*) (e.g., at room temperature and an oscillation frequency of 1 Hz) of greater than 1 GPa, greater than 10 GPa, between 0.5 GPa and 5 GPa, etc.

The hard polymer layers 42B may have a greater modulus (E', E", E*, G', G", or G*) than soft adhesive layers 42A (by a factor of 1.2 or more, a factor of 1.5 or more, a factor of 2 or more, a factor of 10 or more, a factor of 100 or more, a factor of 1,000, a factor of 10,000 or more, a factor of 100,000 or more, etc.). The hard polymer layers 42B may have a greater shear modulus at 10 kHz than soft adhesive layers 42A (by a factor of 1.2 or more, a factor of 1.5 or more, a factor of 2 or more, a factor of 10 or more, a factor of 100 or more, a factor of 1,000, a factor of 10,000 or more, a factor of 100,000 or more, etc.).

The soft adhesive layers 42A provide a low shear modulus in the lateral direction in order to optimize decoupling during folding of the display. The hard polymer layers 42B make the multilayer adhesive stack more rigid in the thickness direction to prevent denting of the adhesive stack during impact events. The hard polymer material may be polyimide or polyethylene terephthalate, as examples.

Properties of the overall multilayer adhesive stack may be tuned by tuning the thicknesses of each individual layer within the stack. For example, the shear modulus of the multilayer adhesive stack at a given frequency may be determined according to the equation $1/P_0 = a/(P_1) + b/(P_2) + c/(P_3) + d/(P_4)\ldots$, where $P_0$ is the shear modulus for the overall multilayer stack at the given frequency, $P_1$ is the shear modulus for the first layer in the stack at the given frequency, a is the coefficient of linear combination for the first layer in the stack (e.g., a is equal to the thickness of the first layer divided by the total thickness of the stack), $P_2$ is the shear modulus for the second layer in the stack at the given frequency, b is the coefficient of linear combination for the second layer in the stack (e.g., b is equal to the thickness of the second layer divided by the total thickness of the stack), etc.

The thicknesses of the individual layers may therefore be tuned to tune the overall properties of multilayer adhesive stack 42. Layers of the same material may have different thicknesses or the same thicknesses (e.g., a first layer 42A may have the same thickness or a different thickness than a different layer 42A). Layers of different materials may have different thicknesses or the same thicknesses (e.g., a layer 42A may have the same thickness or a different thickness than a layer 42B).

Another illustrative multilayer adhesive stack may include alternating layers of soft adhesive and hard elastomer. For example, adhesive layer 42A in FIG. 8 (or FIGS. 9-13) may be formed from a soft adhesive and adhesive layer 42B in FIG. 8 (or FIGS. 9-13) may be formed from a hard elastomer. The soft adhesive layer 42A may have a modulus (E', E", E*, G', G", or G*) (e.g., at room temperature and an oscillation frequency of 1 Hz) of less than 1 megapascal (MPa), less than 0.5 Mpa, less than 0.1 MPa, less than 0.05 MPa, between 0.001 MPa and 0.01 MPa, between 0.01 MPa and 0.5 MPa, between 0.01 MPa and 0.1 MPa, between 0.1 MPa and 0.2 MPa, etc. The hard elastomer layer 42B may have a modulus (E', E", E*, G', G", or G*) (e.g., at room temperature and an oscillation frequency of 1 Hz) of greater than 0.1 MPa, greater than 1 MPa, between 1 MPa and 1 gigapascal (GPa), between 1 MPa and 500 MPa, between 500 MPa and 1 GPa, etc.

The hard elastomer layers 42B may have a greater modulus at 1 Hz than soft adhesive layers 42A (by a factor of 1.2 or more, a factor of 1.5 or more, a factor of 2 or more, a factor of 10 or more, a factor of 100 or more, a factor of 1,000, a factor of 10,000 or more, etc.). The hard elastomer layers 42B may have a greater modulus at 10 kHz than soft adhesive layers 42A (by a factor of 1.2 or more, a factor of 1.5 or more, a factor of 2 or more, a factor of 10 or more, a factor of 100 or more, a factor of 1,000, a factor of 10,000 or more, etc.).

The soft adhesive layers 42A provide a low shear modulus in the lateral direction in order to optimize decoupling during folding of the display. The hard elastomer layers 42B make the multilayer adhesive stack more rigid in the thickness direction to prevent denting of the adhesive stack during impact events.

Another illustrative multilayer adhesive stack may include alternating layers of soft adhesive and glass. For example, adhesive layer 42A in FIG. 8 (or FIGS. 9-13) may be formed from a soft adhesive and adhesive layer 42B in FIG. 8 (or FIGS. 9-13) may be formed from glass. The soft adhesive layer 42A may have a modulus (E', E", E*, G', G", or G*) (e.g., at room temperature and an oscillation frequency of 1 Hz) of less than 1 megapascal (MPa), less than 0.5 Mpa, less than 0.1 MPa, less than 0.05 MPa, between 0.01 MPa and 0.5 MPa, between 0.001 MPa and 0.1 MPa, between 0.1 MPa and 0.2 MPa, etc. The glass layer 42B may have a modulus (E', E", E*, G', G", or G*) (e.g., at room temperature and an oscillation frequency of 1 Hz) of greater than 1 GPa, greater than 10 GPa, greater than 20 GPa, greater than 30 GPa, between 10 GPa and 30 GPa, between 15 GPa and 25 GPa, etc.

The glass layers 42B may have a greater modulus (E', E", E*, G', G", or G*) at 1 Hz than soft adhesive layers 42A (by a factor of 1.2 or more, a factor of 1.5 or more, a factor of 2 or more, a factor of 10 or more, a factor of 100 or more, a factor of 1,000, a factor of 10,000 or more, a factor of 100,000 or more, etc.). The glass layers 42B may have a greater modulus (E', E", E*, G', G", or G*) at 10 kHz than soft adhesive layers 42A (by a factor of 1.2 or more, a factor of 1.5 or more, a factor of 2 or more, a factor of 10 or more, a factor of 100 or more, a factor of 1,000, a factor of 10,000 or more, a factor of 100,000 or more, etc.).

The soft adhesive layers 42A provide a low shear modulus in the lateral direction in order to optimize decoupling during folding of the display. The glass layers 42B make the multilayer adhesive stack more rigid in the thickness direction to prevent denting of the adhesive stack during impact events.

Another illustrative multilayer adhesive stack may include alternating layers of soft adhesive and hard adhesive. For example, adhesive layer 42A in FIG. 8 (or FIGS. 9-13) may be formed from a soft adhesive and adhesive layer 42B in FIG. 8 (or FIGS. 9-13) may be formed from a hard adhesive. The soft adhesive layer 42A may have a modulus (E', E", E*, G', G", or G*) (e.g., at room temperature and at 1 Hz) of less than 1 megapascal (MPa), less than 0.5 Mpa, less than 0.1 MPa, less than 0.05 MPa, between 0.01 MPa and 0.5 MPa, between 0.001 MPa and 0.1 MPa, between 0.1 MPa and 0.2 MPa, etc. The hard adhesive layer 42B may have a modulus (E', E", E*, G', G", or G*) (e.g., at room temperature and 1 Hz) of greater than 0.5 MPa, greater than 0.3 MPa, between 0.5 MPa and 1 MPa, less than 1 megapascal (MPa), less than 0.5 Mpa, less than 0.1 MPa, less than 0.05 MPa, between 0.01 MPa and 0.5 MPa, between 0.01 MPa and 0.1 MPa, between 0.1 MPa and 0.2 MPa, etc.

The hard adhesive layers 42B may have a greater modulus at 1 Hz (E', E", E*, G', G", or G*) than soft adhesive layers 42A (by a factor of 1.2 or more, a factor of 1.5 or more, a factor of 2 or more, a factor of 10 or more, a factor of 100 or more, etc.). The hard adhesive layers 42B may have a greater modulus (E', E", E*, G', G", or G*) at 10 kHz than soft adhesive layers 42A (by a factor of 1.2 or more, a factor of 1.5 or more, a factor of 2 or more, a factor of 10 or more, a factor of 100 or more, etc.).

As one specific example, soft adhesive layers 42A may have a modulus of less than 1 MPa (e.g., between 0.5 MPa and 1 MPa) at an oscillation frequency of 10 kHz whereas hard adhesive layers 42B may have a modulus of greater than 1 MPa (e.g., between 1 MPa and 6 MPa) at an oscillation frequency of 10 kHz.

The soft adhesive layers 42A provide a low shear modulus in the lateral direction in order to optimize decoupling during folding of the display. The hard adhesive layers 42B make the multilayer adhesive stack more rigid in the thickness direction to prevent denting of the adhesive stack during impact events.

Another illustrative multilayer adhesive stack may include alternating layers of adhesive optimized for normal temperatures (e.g., room temperature) and adhesive optimized for low temperatures (e.g., temperatures below 0 degrees Celsius). For example, adhesive layer 42A in FIG. 8 (or FIGS. 9-13) may be formed from an adhesive optimized for normal temperatures and adhesive layer 42B in FIG. 8 (or FIGS. 9-13) may be formed from an adhesive optimized for low temperatures. Adhesive layers 42A (optimized for normal temperatures) in the multilayer adhesive stack may have a glass transition temperature that is greater than −20 degrees Celsius, greater than 0 degrees Celsius, greater than 20 degrees Celsius, between (inclusive) −20 degrees Celsius and 70 degrees Celsius, less than 70 degrees Celsius, etc. Adhesive layers 42B (optimized for low temperatures) in the multilayer adhesive stack may have a glass transition temperature that is less than 0 degrees Celsius, less than −20 degrees Celsius, less than −40 degrees Celsius, etc.

The glass transition temperature for adhesive layers 42B may be lower than the glass transition temperature for adhesive layers 42A (e.g., by 5 degrees Celsius or more, by 20 degrees Celsius or more, by 40 degrees Celsius or more, by 60 degrees Celsius or more, by 100 degrees Celsius or more, etc.).

The layers optimized for low temperatures may have shear stress (at room temperature and 500% shear strain using 200%/min strain rate) of between 1 kPa and 30 kPa, between 1 kPa and 50 kPa, less than 1 kPa, less than 0.1 kPa, less than 10 kPa, less than 100 kPa, less than 1000 kPa, less than 1 GPa, more than 1 kPa, more than 0.1 kPa, more than 10 kPa, more than 100 kPa, more than 1000 kPa, more than 1 GPa between 1 kPa and 100 kPa, etc. The layers optimized for low temperatures may have shear stress (at −20 degrees Celsius and 500% shear strain using 200%/min strain rate) of between 1 kPa and 30 kPa, between 1 kPa and 50 kPa, less than 1 kPa, less than 0.1 kPa, less than 10 kPa, less than 100 kPa, less than 1000 kPa, less than 1 GPa, more than 1 kPa, more than 0.1 kPa, more than 10 kPa, more than 100 kPa, more than 1000 kPa, more than 1 GPa between 1 kPa and 100 kPa, etc. The layers optimized for low temperatures may have shear stress (at 0 degrees Celsius and 500% shear strain using 200%/min strain rate) of between 1 kPa and 30 kPa, between 1 kPa and 50 kPa, less than 1 kPa, less than 0.1 kPa, less than 10 kPa, less than 100 kPa, less than 1000 kPa, less than 1 GPa, more than 1 kPa, more than 0.1 kPa, more than 10 kPa, more than 100 kPa, more than 1000 kPa, more than 1 GPa between 1 kPa and 100 kPa, etc.

Including adhesive layers that are optimized for different temperatures may optimize the performance of the multilayer adhesive stack across a wide range of temperatures.

In a multilayer adhesive stack that varies in the lateral direction (within the XY-plane) in addition to the thickness direction (e.g., as in FIGS. 12 and 13), soft adhesives may be included in a hinge area to optimize for decoupling during folding. For example, in FIG. 12, adhesive layers 42C and 42D may be formed from softer materials (e.g., having smaller modulus at the same conditions) than adhesive layers 42A and 42B. Adhesive layers 42C and 42D may overlap a bend axis (e.g., hinge area) of the flexible display (see bend axis 28 in FIG. 3). The soft materials in the hinge area may be optimized for folding whereas the harder materials (42A and 42B in FIG. 12) are optimized for surface dent prevention and recovery.

In FIG. 13, adhesive layers 42A may be formed from a softer material (e.g., having smaller modulus at the same conditions) than adhesive layers 42B. Adhesive layers 42A that are coplanar with adhesive layers 42B may overlap a bend axis (e.g., hinge area) of the flexible display (see bend axis 28 in FIG. 3). The hinge area therefore only includes the soft adhesive material 42A (to optimize for decoupling during folding) whereas the surrounding non-hinge areas include a harder material (42B in FIG. 13) that is optimized for surface dent prevention and recovery. In FIG. 13, layers 42A may be formed from a soft adhesive whereas layers 42B may be formed from a hard polymer (as one example).

The example in FIG. 13 of having different adhesive materials in the hinge area (that extends in a strip parallel to bend axis 28 across the width of the display/device and adjacent on both sides to non-hinge areas) is merely illustrative. In general, the multilayer adhesive stack may vary within the XY-plane in any desired pattern (e.g., with any desired number of areas having different adhesive materials).

In yet another possible arrangement, the adhesive stack may include only a single layer in the thickness direction (e.g., in the Z-direction in FIG. 12) but may be heterogeneous within the XY-plane (e.g., only the top layer of FIG. 12 or only the second layer of FIG. 12 may be included in the adhesive stack). Within the single adhesive layer, adhesive of a first material may overlap a bend axis of a foldable display (as one example). The adhesive of the first material may be surrounded (within the XY-plane) by an adhesive layer of a second material that is different than the first material. The first material may be softer than the second material.

Figure 14:
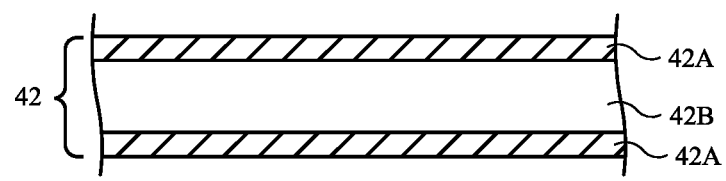
FIG. 14 is a cross-sectional side view of an illustrative multilayer adhesive stack that includes a soft adhesive layer that is interposed between first and second high-adhesion layers in accordance with an embodiment.

FIG. 14 is a cross-sectional side view of another multilayer adhesive stack 42. The adhesive stack in FIG. 14 includes a soft adhesive layer 42B. The soft adhesive layer 42B may provide high decoupling to allow the multilayer adhesive stack to be repeatedly bent during operation of the flexible display. However, soft adhesives (such as adhesive layer 42B) may tend to have lower adhesion than harder adhesives. Accordingly, first and second high-adhesion layers 42A may be formed on one or both sides of the soft adhesive layer 42B. The adhesive layers 42A may have a higher adhesion than adhesive layer 42B. This allows the multilayer adhesive stack to strongly couple to adjacent components within the electronic device. Additionally, because adhesive layers 42A are thin, the overall decoupling capability of the multilayer adhesive stack is not significantly affected.

The example of two high-adhesion layers of the same type being used in the multilayer adhesive stack is merely illustrative. If desired, high-adhesion layers formed from different materials may be included in the multilayer adhesive stack. As one specific example, a first high-adhesion layer at the top of the stack may be optimized to adhere to a glass layer that is formed above the multilayer adhesive stack. A second high-adhesion layer at the bottom of the stack may be optimized to adhere to a polymer layer that is formed below the multilayer adhesive stack. The first and second high-adhesion layers may be formed from different materials.

Each adhesive layer 42A may be thinner than adhesive layer 42B. Each adhesive layer 42A may have a thickness that is less than 50% of the thickness of adhesive layer 42B, may have a thickness that is less than 30% of the thickness of adhesive layer 42B, may have a thickness that is less than 15% of the thickness of adhesive layer 42B, may have a thickness that is less than 10% of the thickness of adhesive layer 42B, may have a thickness that is less than 5% of the thickness of adhesive layer 42B, etc. Adhesive layer 42B may be formed from a softer material (e.g., having smaller modulus at the same conditions) than adhesive layers 42A. As one specific example, soft adhesive layer 42B may have a modulus of less than 0.1 MPa (e.g., between 0.01 MPa and 0.1 MPa) at an oscillation frequency of 1 Hz whereas adhesive layers 42A may have a modulus of greater than 0.1 MPa (e.g., between 0.1 MPa and 0.3 MPa) at an oscillation frequency of 1 Hz.

Figure 15:
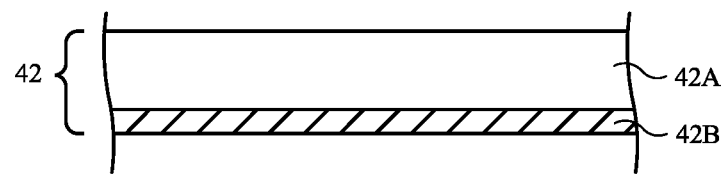
FIG. 15 is a cross-sectional side view of an illustrative multilayer adhesive stack that includes a soft adhesive layer and an ultraviolet light blocking layer in accordance with an embodiment.

In some applications, it may be desirable for the multilayer adhesive stack to block ultraviolet light. In these cases, a thin layer of ultraviolet light blocking adhesive may be included in addition to a soft adhesive layer. FIG. 15 is a cross-sectional side view of a multilayer adhesive stack with an ultraviolet blocking layer. As shown, the adhesive stack in FIG. 15 includes a soft adhesive layer 42A. The soft adhesive layer 42A may provide high decoupling to allow the multilayer adhesive stack to be repeatedly bent during operation of the flexible display. The soft adhesive layer 42A may have a modulus (E', E", E*, G', G", or G*) (e.g., at room temperature and 1 Hz) of less than 1 megapascal (MPa), less than 0.5 Mpa, less than 0.1 MPa, less than 0.05 MPa, between 0.01 MPa and 0.5 MPa, between 0.001 MPa and 0.1 MPa, between 0.1 MPa and 0.2 MPa, etc.

Soft adhesive layer 42A may be optimized for the desired mechanical properties of the multilayer adhesive stack. Ultraviolet light blocking adhesive layer 42B, meanwhile, is optimized for the desired optical properties of the multilayer adhesive stack. Ultraviolet light blocking adhesive layer 42B may block more than 30% of ultraviolet light, more than 50% of ultraviolet light, more than 70% of ultraviolet light, more than 80% of ultraviolet light, more than 90% of ultraviolet light, more than 95% of ultraviolet light, more than 99% of ultraviolet light, etc. Said another way, ultraviolet light blocking adhesive layer 42B may transmit less than 70% of ultraviolet light, less than 50% of ultraviolet light, less than 30% of ultraviolet light, less than 20% of ultraviolet light, less than 10% of ultraviolet light, less than 5% of ultraviolet light, less than 1% of ultraviolet light, etc. This may prevent ultraviolet light from damaging an underlying display panel (e.g., as in FIG. 4). To ensure that light from the display panel is still visible to a viewer, ultraviolet light blocking adhesive layer 42B may have a transparency to visible light that is greater than 99.9%, greater than 99%, greater than 95%, greater than 90%, greater than 80%, etc.

Adhesive layer 42B may be thinner than adhesive layer 42A. Adhesive layer 42B in FIG. 15 may have a thickness that is less than 50% of the thickness of adhesive layer 42A, may have a thickness that is less than 30% of the thickness of adhesive layer 42A, may have a thickness that is less than 15% of the thickness of adhesive layer 42A, may have a thickness that is less than 10% of the thickness of adhesive layer 42A, may have a thickness that is less than 5% of the thickness of adhesive layer 42A, etc. Adhesive layer 42B may transmit less ultraviolet light than adhesive layer 42A.

Figure 16:
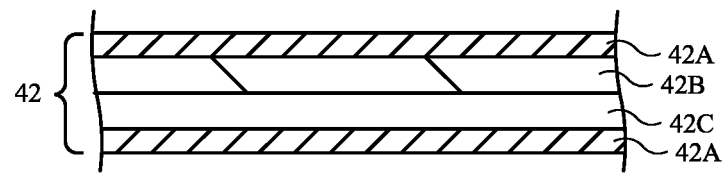
FIG. 16 is a cross-sectional side view of an illustrative multilayer adhesive stack that includes an adhesive layer with a low glass transition temperature in accordance with an embodiment.

In the example of FIG. 14, a soft adhesive layer is interposed between first and second high-adhesion layers that are harder than the soft adhesive layer. To further optimize for different temperature conditions, the multilayer adhesive stack may also include an adhesive layer that is optimized for low temperatures. FIG. 16 is a cross-sectional side view of a multilayer adhesive stack that includes an adhesive layer 42C that is optimized for low temperatures. Adhesive layer 42C is interposed between a soft adhesive layer 42B and a harder, high-adhesion layer 42A (both already described in connection with FIG. 14).

Adhesive layers 42A and 42B (optimized for normal temperatures) in the multilayer adhesive stack may have a glass transition temperature that is greater than −20 degrees Celsius, greater than 0 degrees Celsius, greater than 20 degrees Celsius, between (inclusive) −20 degrees Celsius and 70 degrees Celsius, less than 70 degrees Celsius, etc. Adhesive layers 42C (optimized for low temperatures) in the multilayer adhesive stack may have a glass transition temperature that is less than 0 degrees Celsius, less than −20 degrees Celsius, less than −40 degrees Celsius, etc.

Figure 17:
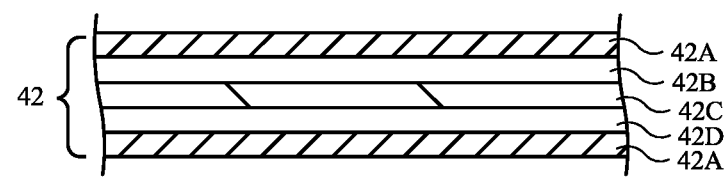
FIG. 17 is a cross-sectional side view of an illustrative multilayer adhesive stack that includes a high-damping adhesive layer in accordance with an embodiment.

To further optimize the multilayer adhesive stack, the multilayer adhesive stack may also include an adhesive layer that is optimized for high damping and cushioning performance under high frequency of stress to reduce the impact force to the delicate layers in the display during impact events. FIG. 17 is a cross-sectional side view of a multilayer adhesive stack that includes a soft adhesive layer 42C (similar to layer 42B as described in FIGS. 14 and 16) that is optimized for high decoupling, an adhesive layer 42D (similar to layer 42C as described in FIG. 16) that is optimized for low temperatures, high-adhesion layers 42A as described in FIGS. 14 and 16, and a high-damping adhesive layer 42B. In FIG. 17, the high-damping adhesive layer 42B is interposed between high-adhesion layer 42A and soft adhesive layer 42C. The high-damping adhesive layer 42B may have a high loss modulus to storage modulus ratio (tan delta) at impact frequency to maximize impact energy absorption and dissipation. Alternatively or in addition, the high-damping adhesive layer 42B may have a low storage modulus at impact frequency to prolong the impact duration and thus reduce the instantaneous peak stress. The high-damping adhesive layer 42B may add impact damping or cushioning capability to the multilayer adhesive stack to prevent panel failure during impacts.

Adhesive layer 42B in FIG. 17 may be formed from a more viscous material or softer material under high frequency of stress (e.g., having a higher tan delta or lower storage modulus at the same conditions) than adhesive layer 42C.

Figure 18:
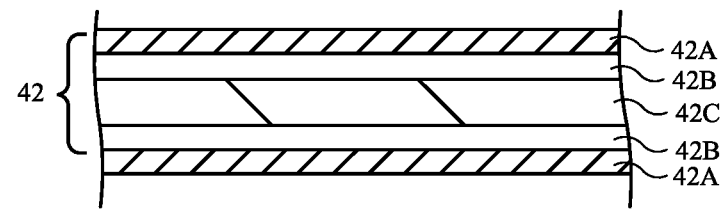
FIG. 18 is a cross-sectional side view of an illustrative multilayer adhesive stack that includes adhesion promoting layers in accordance with an embodiment.

To ensure adequate adhesion between adjacent layers within the multilayer adhesive stack, one or more adhesion promoting layers may be included in the multilayer adhesive stack. FIG. 18 is a cross-sectional side view of a multilayer adhesive stack that includes adhesion promoting layers. First and second adhesion promoting layers 42B are included in the multilayer stack of FIG. 18. Each adhesion promoting layer 42B is interposed between a respective high-adhesion layer 42A (as described in connection with FIG. 14) and soft adhesive layer 42C (similar to layer 42B as described in connection with FIG. 14).

Adhesion promoting layer 42B may be formed from a material that has a high adhesion to both adhesive layers 42C and 42A. With the presence of adhesion promoting layer 42B, the adhesion between adhesive layers 42A and 42C may be stronger than if adhesive layers 42A and 42C were attached directly together (e.g., as in FIG. 14).

The order of the layers in the multilayer adhesive stacks shown herein are merely illustrative. The orders of the layers within the multilayer adhesive stacks may be changed if desired.

Figure 19:
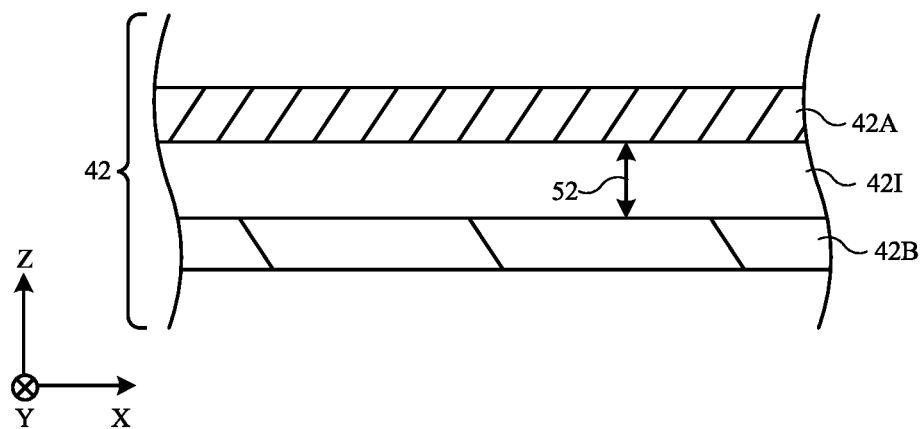
FIG. 19 is a cross-sectional side view of an illustrative multilayer adhesive stack with a gradient interface layer between vertically adjacent adhesive layers in accordance with an embodiment.

It should be understood that the interface between layers within adhesive 42 may not necessarily be a sharp interface with a well defined boundary. Instead, the interface between layers 42 within adhesive 42 may sometimes follow a composition gradient. FIG. 19 is a cross-sectional side view of a multilayer adhesive stack 42 of this type. As shown, a gradient interface layer 42I is interposed between adhesive layer 42A and adhesive layer 42B. Adhesive layers 42A and 42B may be formed from different materials having different properties in order to optimize the performance of the adhesive (as discussed in detail above). Gradient interface layer 42I may have a composition that is 100% equal to the composition of adhesive layer 42A at the border between layers 42I and 42A. Gradient interface layer 42I may have a composition that is 100% equal to the composition of adhesive layer 42B at the border between layers 42I and 42B. The composition of layer 42I may gradually change while moving from the border adjacent to layer 42A towards the border adjacent to layer 42B (e.g., with an increasing proportion of composition equal to the composition of adhesive layer 42B and a decreasing proportion of composition equal to the composition of adhesive layer 42A).

Figure 20:
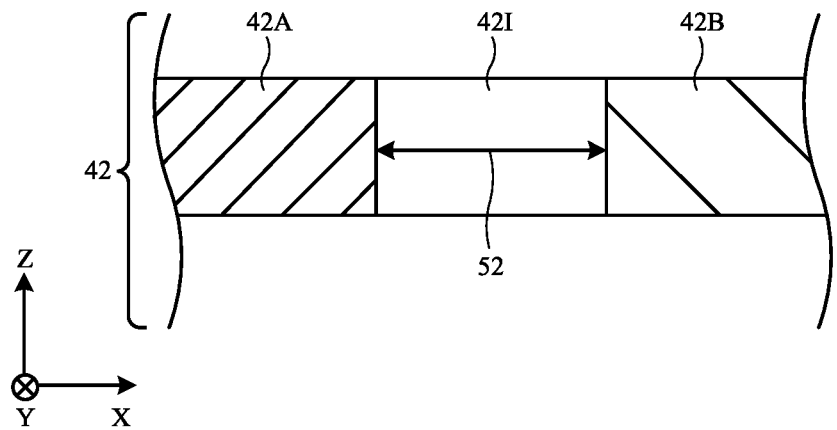
FIG. 20 is a cross-sectional side view of an illustrative multilayer adhesive stack with a gradient interface layer between horizontally adjacent adhesive layers in accordance with an embodiment.

The gradient can be in the vertical direction and/or in the horizontal direction. FIG. 19 shows an example where the gradient is in the vertical direction (parallel to the Z-axis). FIG. 20 shows an example where the gradient is in the horizontal direction (parallel to the X-axis).

Gradient interface layer 42I may be formed naturally due to inter-diffusion between adjacent layers (e.g., immediately after fabrication and/or slowly over time). Alternatively, gradient interface layer 42I may be introduced by design to achieve certain performance benefits.

The gradient may be a material/chemistry gradient (e.g., a gradient of additive concentration, material type, molecular weight, polymer cross-linking level, polymer chain branching, etc.) and/or a property gradient (e.g., a gradient of modulus, glass transition temperature, refractive index, etc.).

Gradient interface layer 42I has a thickness 52 (in the direction of the gradient).

Thickness 52 may be less than 1 centimeter, less than 1 millimeter, less than 1 micron, less than 1 nanometer, greater than 1 centimeter, greater than 1 millimeter, greater than 1 micron, greater than 1 nanometer, etc.). The gradient across thickness 52 may be linear or non-linear.

Figure 21:
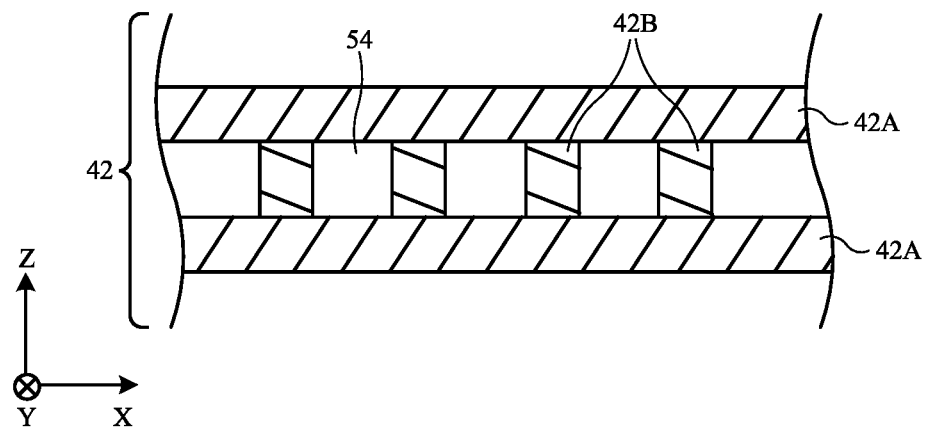
FIG. 21 is a cross-sectional side view of an illustrative multilayer adhesive stack with an array of pillar structures in accordance with an embodiment.
Figure 22:
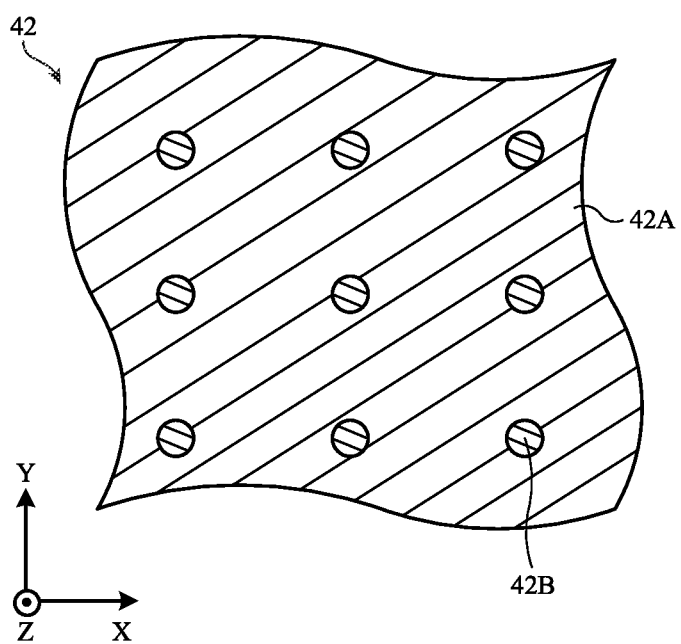
FIG. 22 is a cross-sectional top view of the multilayer adhesive stack of FIG. 21 in accordance with an embodiment.

FIGS. 21 and 22 show yet another possible arrangement for a multilayer adhesive stack. FIG. 21 is a cross-sectional side view of a multilayer adhesive stack 42 with an array of pillar structures. FIG. 22 is a cross-sectional top view of the multilayer adhesive stack of FIG. 21.

As shown in FIG. 21, first and second adhesive layers 42A may be separated by a gap. An array of patches of adhesive layer 42B (sometimes referred to as pillars 42B) are interposed between the first and second adhesive layers 42A. The pillars of adhesive layer 42B are discrete pillars arranged in a grid (as one example). The space 54 between the patches of adhesive layer 42B may be filled with air or another desired filler material (e.g., an additional adhesive layer 42C). Adhesive layers 42A and 42B may be formed from different materials having different properties in order to optimize the performance of the adhesive (as discussed in detail above).

The magnitude of the gap between first and second adhesive layers 42A in FIG. 21 (which is also equal to the thickness of adhesive layers 42B) may be less than 1 centimeter, less than 1 millimeter, less than 1 micron, less than 1 nanometer, greater than 1 centimeter, greater than 1 millimeter, greater than 1 micron, greater than 1 nanometer, etc.).

Any of the multilayer adhesive stacks in FIG. 8-21 may be used in any of the locations shown in FIGS. 4-7. Any desired materials may be used in the aforementioned multilayer adhesive stacks of FIGS. 8-21.

In any of the adhesive stacks shown in FIGS. 8-21, a first layer that is adjacent to a second layer (e.g., vertically stacked or horizontally adjacent) may be formed by a treatment on the second layer. For example, a physical or chemical treatment may be applied to the second layer that modifies a portion of the second layer to form the first layer. As one illustrative example, a second layer may receive an edge treatment (e.g., around its periphery) such as UV overcuring. The UV overcuring may form a first layer with modified properties (e.g., the first layer may be harder than the second layer). The first layer may prevent the softer second layer from oozing out of an edge of the device.

The foregoing is merely illustrative and various modifications can be made to the described embodiments. The foregoing embodiments may be implemented individually or in any combination.

What is claimed is:

1. An electronic device, comprising:
    a flexible display panel; and
    a multilayer adhesive stack that is attached to the flexible display panel, wherein the multilayer adhesive stack includes a first layer of adhesive formed from a first material, a second layer of adhesive formed from a second material and in direct contact with the first layer of adhesive, and a third layer of adhesive formed from a third material and in direct contact with the second layer of adhesive, wherein the first layer of adhesive has a first magnitude for a property, and wherein the second layer of adhesive has a second magnitude that is different than the first magnitude for the property.

2. The electronic device defined in claim 1, wherein the property is modulus and wherein the first magnitude is less than 100 kPa.

3. The electronic device defined in claim 2, wherein the second magnitude is between 500 MPa and 10 GPa.

4. The electronic device defined in claim 2, wherein the second magnitude is between 0.01 MPa and 1 GPa.

5. The electronic device defined in claim 2, wherein the second magnitude is greater than 10 GPa.

6. The electronic device defined in claim 1, wherein the first material is a soft adhesive.

7. The electronic device defined in claim 6, wherein the second material is a hard adhesive.

8. The electronic device defined in claim 6, wherein the second layer of adhesive is a high-adhesion layer having a higher adhesion than the first layer of adhesive.

9. The electronic device defined in claim 1, wherein the multilayer adhesive stack further comprises a hard polymer.

10. The electronic device defined in claim 1, wherein the multilayer adhesive stack further comprises a hard elastomer.

11. The electronic device defined in claim 1, wherein the multilayer adhesive stack further comprises glass.

12. The electronic device defined in claim 1, wherein the multilayer adhesive stack also includes an adhesion promotion layer that is interposed between the first layer of adhesive and the second layer of adhesive.

13. The electronic device defined in claim 1, wherein the multilayer adhesive stack includes a repeating unit of layers that includes the first layer of adhesive and the second layer of adhesive.

14. The electronic device defined in claim 1, wherein the property is glass transition temperature.

15. The electronic device defined in claim 1, wherein the property is transmission of ultraviolet light.

16. The electronic device defined in claim 1, wherein the second layer of adhesive is formed by modifying a portion of the first layer of adhesive by physical or chemical treatment.

17. The electronic device defined in claim 1, wherein the third material is different than the first and second materials.

18. The electronic device defined in claim 17, wherein the adhesive stack includes a fourth layer of adhesive formed from a fourth material that is different than the first, second, and third materials.

19. The electronic device defined in claim 1, wherein the first and second layers of adhesive are coplanar.

20. The electronic device defined in claim 1, wherein the first and second layers of adhesive are vertically stacked.

21. The electronic device defined in claim 1, wherein the flexible display panel is a scrollable display.

22. The electronic device defined in claim 1, wherein the multilayer adhesive stack includes a gradient interface layer between the first layer of adhesive and the second layer of adhesive.

23. The electronic device defined in claim 1, wherein the third material is the same as the first material, wherein the second layer of adhesive is interposed between the first and third layers of adhesive, and wherein the second layer of adhesive is part of an array of pillar structures formed from the second material.

24. An electronic device, comprising:
    a foldable housing that is configured to bend about a bend axis;
    a flexible display panel that overlaps the bend axis;
    a display cover layer that overlaps the flexible display panel; and
    a multilayer adhesive stack that attaches the flexible display panel to the display cover layer, wherein the multilayer adhesive stack includes at least first, second, and third layers that are formed from different materials, and wherein the third layer has a lower glass transition temperature than the first and second layers.

25. The electronic device defined in claim 24, wherein the first layer is thicker than the second layer and wherein the first layer is softer than the second layer.

26. The electronic device defined in claim 24, wherein the first layer is formed from a first material, wherein the second layer is formed from a second material, wherein the first and second layers are coplanar, and wherein the second layer overlaps the bend axis.

27. The electronic device defined in claim 24, wherein the first layer comprises a high-adhesion layer and the second layer comprises a soft adhesive layer.

28. An electronic device, comprising:
    a flexible display panel;
    a multilayer adhesive stack that is attached to the flexible display panel, wherein the multilayer adhesive stack includes a first layer formed from a first material and a second layer formed from a second material and wherein the first and second layers are coplanar; and a display cover layer that overlaps the flexible display panel, wherein the multilayer adhesive stack is interposed between the flexible display panel and the display cover layer, wherein the flexible display panel has a bend axis, and wherein the first layer extends in a strip that overlaps the bend axis.

29. The electronic device defined in claim 28, wherein the second material is different than the first material.

* * * * *